(12) United States Patent
Yamamoto et al.

(10) Patent No.: US 9,967,688 B2
(45) Date of Patent: May 8, 2018

(54) AUDIO PROCESSING DEVICE

(71) Applicant: Onkyo Corporation, Osaka (JP)

(72) Inventors: Kuniaki Yamamoto, Osaka (JP); Tetsuya Nagano, Osaka (JP)

(73) Assignee: Onkyo Corporation, Osaka (JP)

( * ) Notice: Subject to any disclaimer, the term of this patent is extended or adjusted under 35 U.S.C. 154(b) by 64 days.

(21) Appl. No.: 15/166,331

(22) Filed: May 27, 2016

(65) Prior Publication Data

US 2016/0381477 A1 Dec. 29, 2016

(30) Foreign Application Priority Data

Jun. 25, 2015 (JP) ................. 2015-127998

(51) Int. Cl.
| | |
|---|---|
| *H04R 29/00* | (2006.01) |
| *H04R 5/02* | (2006.01) |
| *G06F 3/16* | (2006.01) |
| *H01L 27/06* | (2006.01) |
| *H01L 27/082* | (2006.01) |
| *H04R 3/00* | (2006.01) |
| *G06F 1/24* | (2006.01) |
| *G06F 1/32* | (2006.01) |

(52) U.S. Cl.
CPC ............ *H04R 29/00* (2013.01); *G06F 1/24* (2013.01); *G06F 1/325* (2013.01); *G06F 1/3287* (2013.01); *G06F 3/162* (2013.01); *H01L 27/0658* (2013.01); *H01L 27/0826* (2013.01); *H04R 3/00* (2013.01); *H04R 5/02* (2013.01); *Y02B 60/1282* (2013.01)

(58) Field of Classification Search
CPC .......... G06F 1/24; G06F 1/325; G06F 1/3287; G06F 3/162; G06F 1/32; G06F 1/3203; G06F 1/3206; G06F 1/3234; G06F 1/3243; H04R 29/00; H04R 3/00; H04R 5/02; H01L 27/0658; H01L 27/0826
See application file for complete search history.

(56) References Cited

U.S. PATENT DOCUMENTS 3,936,731 A * 2/1976 Wheatley, Jr. ............ H03F 1/56
 330/255
5,822,598 A * 10/1998 Lam .......................... G06F 1/32
 713/324
5,838,983 A 11/1998 Atkinson
(Continued)

FOREIGN PATENT DOCUMENTS

| EP | 2 398 256 A2 | 12/2011 |
|---|---|---|
| JP | 2011-234247 | 11/2011 |
| JP | 2015-065502 | 4/2015 |

*Primary Examiner* — Jason R Kurr
(74) *Attorney, Agent, or Firm* — Renner Otto Boisselle & Sklar, LLP (57) ABSTRACT

To be able to activate a self-device when an input digital audio signal is an audio signal indicating sound.

An AV receiver 1 includes a detection circuit 4 that detects that a digital audio signal terminal is connected and supplies a detection signal, a DIR 5 that converts an SPDIF signal into an I2S signal when the detection circuit 4 supplies the detection signal, a detection circuit 7 that detects that the I2S signal into which the DIR 5 convers is an audio signal indicating sound and supplies a detection signal, and a microcomputer 2 that activates the AV receiver 1 when the detection circuit 7 supplies the detection signal.

12 Claims, 11 Drawing Sheets

(56) References Cited

U.S. PATENT DOCUMENTS

| | | | | |
|---|---|---|---|---|
| 5,874,771 | A * | 2/1999 | Hurkx | H01L 27/0658 |
| | | | | 257/536 |
| 6,148,345 | A * | 11/2000 | Yamaki | G06F 1/3203 |
| | | | | 709/219 |
| 6,690,431 | B1 | 2/2004 | Yang et al. | |
| 8,024,055 | B1 * | 9/2011 | Holmgren | H03F 1/52 |
| | | | | 381/120 |
| 9,503,033 | B2 * | 11/2016 | Lin | H03F 3/181 |
| 2004/0146034 | A1 * | 7/2004 | Chou | H04H 20/28 |
| | | | | 370/338 |
| 2010/0092009 | A1 * | 4/2010 | Shimomura | H03F 3/181 |
| | | | | 381/120 |
| 2011/0261978 | A1 * | 10/2011 | Yamaguchi | G06F 1/3203 |
| | | | | 381/120 |
| 2012/0275624 | A1 | 11/2012 | Ho et al. | |
| 2014/0294204 | A1 | 10/2014 | Lin | |

* cited by examiner

| | MICRO-COMPUTER | DETECTION SIGNAL | RESET LOGIC VALUE |
|---|---|---|---|
| CONNECTION | INPUT (Hi-Z) | HIGH | HIGH |
| NO CONNECTION | INPUT (Hi-Z) | LOW | LOW |
| CONNECTION | HIGH | HIGH | HIGH |
| NO CONNECTION | HIGH | LOW | HIGH |
| CONNECTION | LOW | HIGH | LOW |
| NO CONNECTION | LOW | LOW | LOW |

AUDIO PROCESSING DEVICE

BACKGROUND OF THE INVENTION

1. Field of the Invention

The present invention relates to an audio processing device that performs audio signal processing to a digital audio signal.

2. Description of the Related Art

Figure 11:
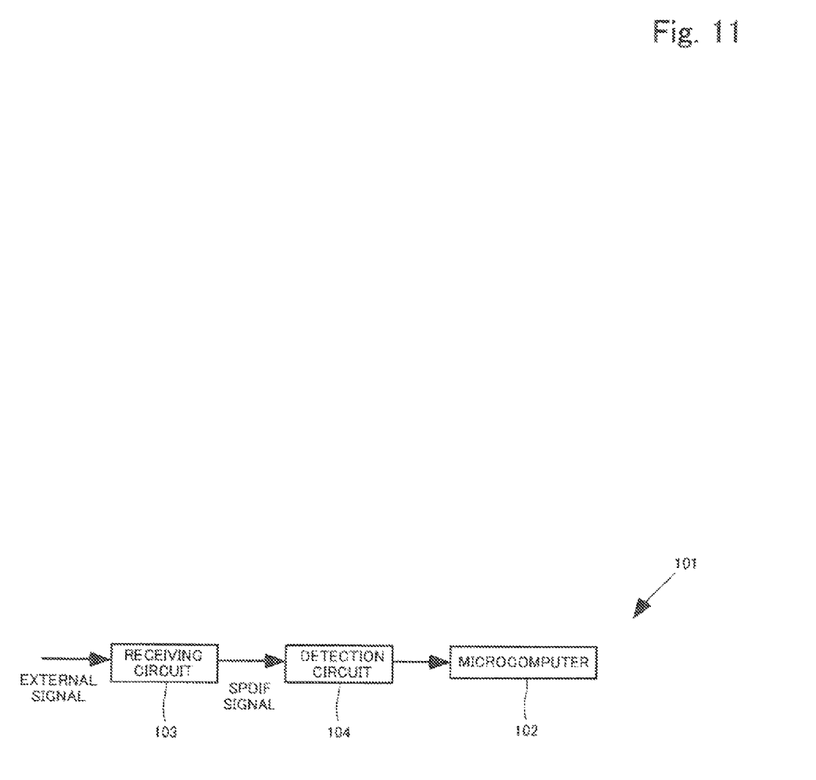
FIG. 11 is a block diagram illustrating a conventional AV receiver.

In recent years, there is an audio processing device that is configured to activate so as to achieve energy saving when external equipment is connected. As the audio processing device, there is an AV receiver that performs audio signal processing such as sound field processing, D/A conversion, and amplification to a digital audio signal (for example, see JP 2015-065502 A). FIG. 11 is a block diagram illustrating configuration of a conventional AV receiver. For example, an AV receiver 101 is connected to a CD player that is external equipment by an optical digital cable. The CD player reads digital data from a CD and outputs an SPDIF signal to the AV receiver 101.

The AV receiver 101 includes a receiving circuit 103, a detection circuit 103, and a microcomputer 102. The AV receiver 101 includes a DSP (Digital Signal Processor) and so on, but description is omitted. The receiving circuit 103 receives the SPDIF signal that is output from the CD player. The detection circuit 104 detects that a digital audio signal terminal is connected and supplies a detection signal. The microcomputer 102 activates the AV receiver 101 when the detection circuit 104 supplies the detection signal.

However, it cannot be judged whether the SPDIF signal is an audio signal indicating sound or not because the SPDIF signal is a bi-phase signal. For this reason, there is a problem that although the SPDIF signal is silence, the AV receiver activates, and wasteful electric power is consumed.

SUMMARY OF THE INVENTION

An objective of the present invention is to be able to activate a self-device when an input digital audio signal is an audio signal indicating sound.

An audio processing device comprising: a first detection circuit that detects that a digital audio signal terminal is connected and supplies a first detection signal; a conversion circuit that converts a first digital audio signal that complies with standards for transferring between two pieces of equipment into a second digital audio signal that complies with standards for serially transferring when the first detection circuit supplies the first detection signal; a second detection circuit that detects that the second digital audio signal into which the conversion circuit convers is an audio signal indicating sound and supplies a second detection signal; and a microcomputer that activates a self-device when the second detection circuit supplies the second detection signal.

For example, when a first digital audio signal that complies with standards for transferring between two pieces of equipment is an SPDIF signal, whether the SPDIF signal is an audio signal indicating sound or not cannot be judged because the SPDIF signal is a bi-phase signal. In the present invention, a conversion circuit converts the first digital audio signal into a second digital audio signal that complies with standards for serially transferring, for example, an I2S signal. In the I2S signal, an audio signal indicating silence is low level. For this reason, a second detection circuit can detect that the second digital audio signal is an audio signal indicating sound by detecting a signal including high level and supply a second detection signal. And, a microcomputer activates a self-device when the second detection circuit supplies the second detection signal.

Thus, according to the present invention, the self-device can be activated when the first digital signal is an audio signal indicating sound.

Preferably, further comprising: a power supply for the conversion circuit; wherein the first detection signal is supplied to an enable terminal of the power supply for the conversion circuit, and the power supply for the conversion circuit is connected to a power supply terminal of the conversion circuit and supplies power supply voltage to the conversion circuit when the first detection signal is supplied to the enable terminal.

In the present invention, a power supply for the conversion circuit is connected to a power supply terminal of the conversion circuit and supplies power supply voltage to the conversion circuit when a first detection signal is supplied to an enable terminal. Therefore, the power supply voltage can be supplied to the conversion circuit when a digital audio signal terminal is connected.

Preferably, wherein the first detection signal is supplied to a reset terminal of the conversion circuit.

In the present invention, the first detection signal is supplied to a reset terminal of the conversion circuit. Therefore, for example, in the conversion circuit, reset is released because a high level signal as the detection signal is supplied to the reset terminal of the conversion circuit.

An audio processing device comprising: a first detection circuit that detects that a digital audio signal terminal is connected and supplies a first detection signal; a microcomputer that activates a conversion circuit when the first detection circuit supplies the first detection signal; the conversion circuit that converts a first digital audio signal that complies with standards for transferring between two pieces of equipment into a second digital audio signal that complies with standards for serially transferring; and a second detection circuit that detects that the second digital audio signal into which the conversion circuit convers is an audio signal indicating sound and supplies a second detection signal; wherein the microcomputer activates a self-device when the second detection circuit supplies the second detection signal.

For example, when a first digital audio signal that complies with standards for transferring between two pieces of equipment is an SPDIF signal, whether the SPDIF signal is an audio signal indicating sound or not cannot be judged because the SPDIF signal is a bi-phase signal. In the present invention, a conversion circuit converts the first digital audio signal into a second digital audio signal that complies with standards for serially transferring, for example, an I2S signal. In the I2S signal, an audio signal indicating silence is low level. For this reason, a second detection circuit can detect that the second digital audio signal is an audio signal indicating sound by detecting a signal including high level and supply a second detection signal. And, a microcomputer activates a self-device when the second detection circuit supplies the second detection signal.

Thus, according to the present invention, the self-device can be activated when the first digital audio signal is an audio signal indicating sound.

Preferably, wherein the conversion circuit has multiple input terminals to which the first digital audio signal is input, the first digital audio signal is input to one of the multiple input terminals, and the microcomputer is connected to a control terminal of the conversion circuit.

In the present invention, the microcomputer can set input of the conversion circuit to an optional input terminal by supplying a control signal to a control terminal after releasing reset of the conversion circuit.

Preferably, further comprising: a power supply for the conversion circuit; wherein the microcomputer is connected to an enable terminal of the power supply for the conversion circuit and supplies an enable signal to the enable terminal when the first detection circuit supplies the first detection signal, and the power supply for the conversion circuit is connected to a power supply terminal of the conversion circuit and supplies power supply voltage to the conversion circuit when the enable signal is supplied to the enable terminal.

In the present invention, a power supply for the conversion circuit is connected to a power supply terminal of the conversion circuit and supplies power supply voltage to the conversion circuit when an enable signal is supplied to an enable terminal. Therefore, the power supply voltage can be supplied to the conversion circuit when a digital audio signal terminal is connected.

Preferably, wherein the microcomputer is connected to a reset terminal of the conversion circuit and supplies a reset signal to the reset terminal when the first detection circuit supplies the first detection signal.

In the present invention, the microcomputer is connected to a reset terminal of the conversion circuit and supplies a reset signal to the reset terminal when the first detection circuit supplies the first detection signal. Therefore, for example, in the conversion circuit, reset is released because a high level signal as the reset signal is supplied to the reset terminal.

Preferably, wherein the detection circuit has an npn type first bipolar transistor in which a collector is connected to a power supply via a resistor, and in which an emitter is connected to ground potential, the second digital audio signal is input to abase of the first transistor, and output of the second detection circuit is between the resistor and the collector of the first bipolar transistor.

In the present invention, the second digital signal is input to a base of an npn type first bipolar transistor composing the second detection circuit. Further, a collector of the first bipolar transistor is connected to a power supply via a resistor. Further, an emitter of the first bipolar transistor is connected to ground potential. Further, output of the second detection circuit is between the resistor and the collector of the first bipolar transistor.

Herein, when the second digital audio signal is the I2S signal, in the I2S signal, an audio signal indicating silence is low level and an audio signal indicating sound includes a high level signal. The first bipolar transistor becomes ON state because the high level signal is input to the base of the first bipolar transistor. The second detection circuit supplies the low level signal as a detection signal from output. Thus, according to the present invention, an audio signal indicating sound can be detected by the second detection circuit of simple configuration using the bipolar transistor.

Preferably, wherein the first detection circuit has an npn type second bipolar transistor in which an emitter is connected to ground potential and in which a collector is connected to a base of a third bipolar transistor and the pnp type third transistor in which a base is connected to the collector of the second bipolar transistor, in which a collector is output of the first detection circuit, and in which an emitter is connected to a power supply, and the first digital audio signal is input to a base of the second bipolar transistor.

In the present invention, the second digital audio signal is input to a base of an npn type second bipolar transistor composing the first detection circuit. Further, an emitter of the second bipolar transistor is connected to ground potential. Further, a collector of the second bipolar transistor is connected to a base of a third bipolar transistor. Further, the base of a pnp type third bipolar transistor composing the first detection circuit is connected to the collector of the second bipolar transistor. Further, a collector of the third bipolar transistor is output of the first detection circuit. Further, an emitter of the third bipolar transistor is connected to a power supply.

Therefore, when a digital audio signal terminal is connected and the second digital audio signal is input, base voltage of the second bipolar transistor is high level potential against emitter voltage of the second bipolar transistor and the second bipolar transistor becomes ON state. Due to this, base voltage of the third bipolar transistor is low level potential against emitter voltage of the third bipolar transistor and the third bipolar transistor becomes ON state. For this reason, the first detection circuit supplies a high level signal as the first detection signal from the output. Thus, according to the present invention, the first detection circuit of simple configuration using the bipolar transistor can detect that the digital audio signal terminal is connected.

Preferably, wherein the conversion circuit is a digital interface receiver.

Preferably, wherein the first digital audio signal is an SPDIF signal.

Preferably, wherein the second digital audio signal is an I2S signal.

According to the present invention, the self-device can be activated when an input digital audio signal is an audio signal indicating sound.

DETAILED DESCRIPTION OF THE PREFERRED EMBODIMENTS

First Embodiment

Figure 1:
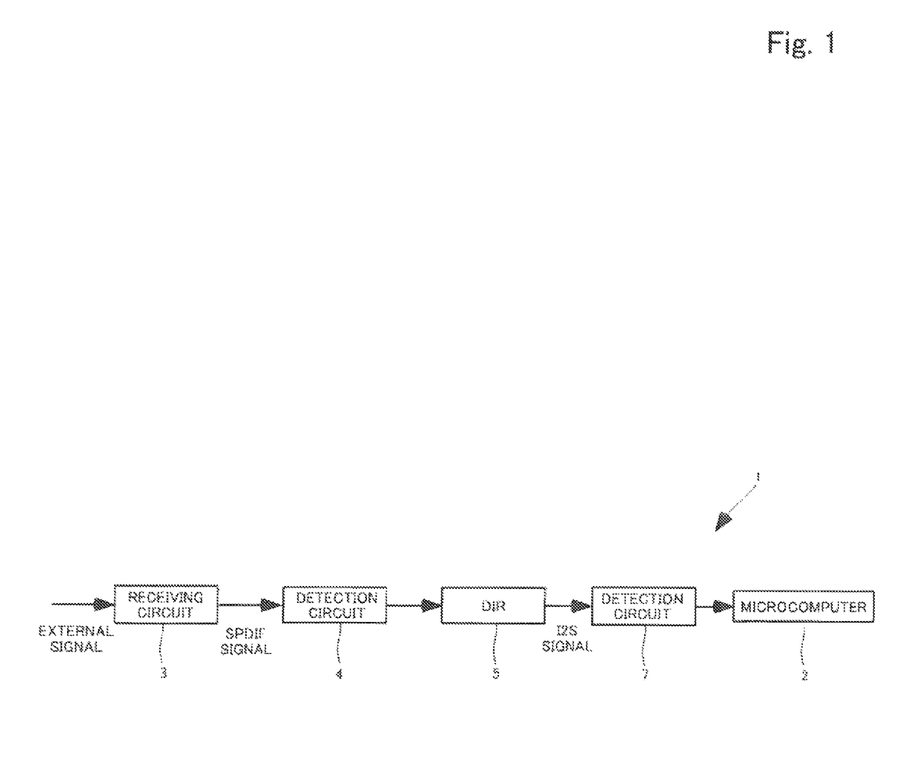
FIG. 1 is a block diagram illustrating configuration of an AV receiver according to a first embodiment of the present invention.
Figure 2:
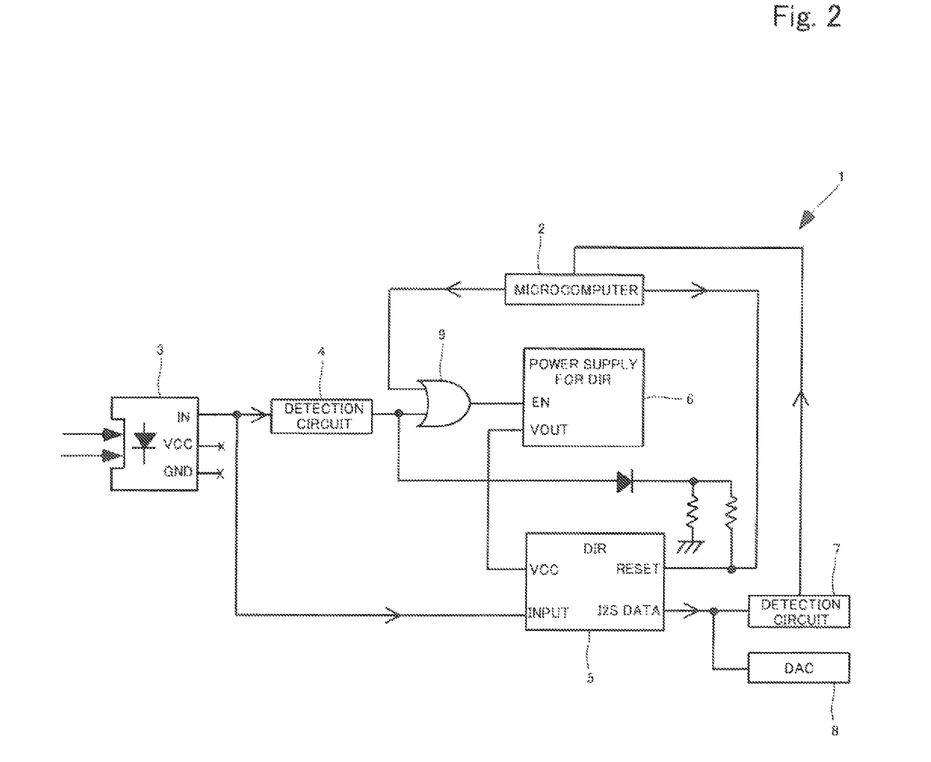
FIG. 2 is a block diagram illustrating configuration of the AV receiver according to the first embodiment of the present invention.

An embodiment of the present invention is described below. FIG. 1 and FIG. 2 are respectively a block diagram illustrating configuration of an AV receiver according to a first embodiment of the present invention. For example, an AV receiver 1 (audio processing device) is connected to a CD player (not shown) that is external equipment by an optical digital cable. The CD player reads digital data from a CD and outputs an SPDIF signal to the AV receiver 1.

The AV receiver 1 includes a microcomputer 2, a receiving circuit 3, a detection circuit 4, a DIR 5, a power supply for the DIR 6, a detection circuit 7 and a DAC 8. The microcomputer 2 controls respective sections composing the AV receiver 1. The receiving circuit 3 receives the SPDIF signal (first digital audio signal) that is output from the CD player.

Figure 3:
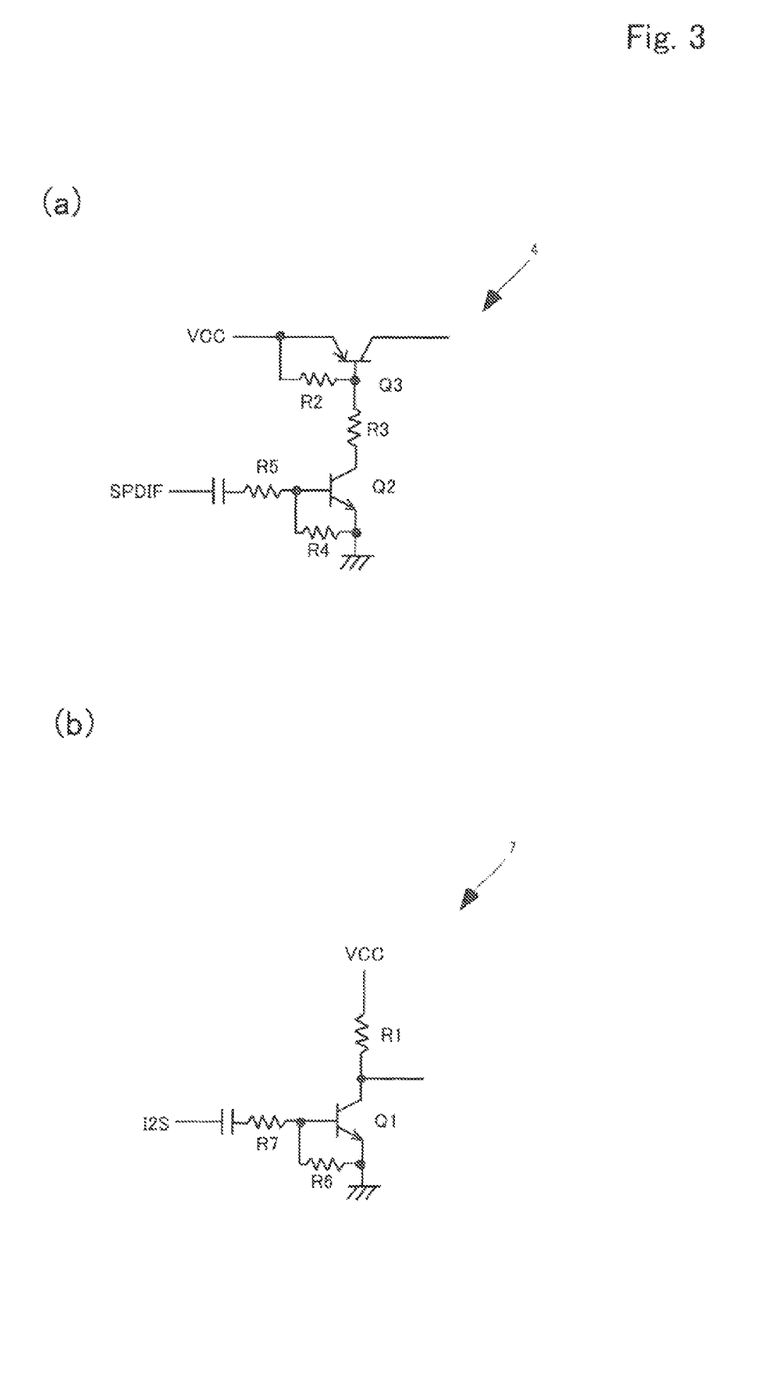
FIG. 3 is a diagram illustrating circuit configuration of a detection circuit.

The detection circuit 4 (first detection circuit) detects that a digital audio signal terminal (optical digital cable) is connected and supplies a detection signal (first detection signal). FIG. 3 (a) is a diagram illustrating circuit configuration of the detection circuit 4. As illustrated in FIG. 3(a), the detection circuit 4 has bipolar transistors Q2 and Q3. The bipolar transistor Q2 (second bipolar transistor) is an npn type, that is to say, a bipolar transistor that becomes ON state when base voltage is high level potential against emitter voltage. The SPDIF signal is input to a base of the bipolar transistor Q2. An emitter of the bipolar transistor Q2 is connected to ground potential. A collector of the bipolar transistor Q2 is connected to a base of the bipolar transistor Q3. In the bipolar transistor Q2, a resistor R4 is connected between the base and the emitter. A resistor R5 is connected to the base of the bipolar transistor Q2.

The bipolar transistor Q3 (third bipolar transistor) is a pnp type, that is to say, a bipolar transistor that becomes ON state when base voltage is low level potential against emitter voltage. The base of the bipolar transistor Q3 is connected to the collector of the bipolar transistor Q2. A collector of the bipolar transistor Q3 is output of the detection circuit 4. An emitter of the bipolar transistor Q3 is connected to a power supply VCC. In the bipolar transistor Q3, a resistor R2 is connected between the base and the emitter. A resistor R3 is connected to the base of the bipolar transistor Q3.

When the digital audio signal terminal is connected and the SPDIF signal is input, in the bipolar transistor Q2 of the detection circuit 4, base voltage is high level potential against emitter voltage and the bipolar transistor Q2 becomes ON state. Due to this, in the bipolar transistor Q3, base voltage is low level potential against emitter voltage and the bipolar transistor Q3 becomes ON state. For this reason, the detection circuit 4 supplies a high level signal from the output as the detection signal.

The DIR (Digital Interface Receiver) 5 (conversion circuit) coverts the SPDIF signal into an I2S signal (second digital audio signal) when the detection circuit 4 supplies the detection signal. The SPDIF signal is a digital audio signal that complies with standards for transferring between two pieces of equipment. The I2S signal is a digital audio signal that complies with standards for serially transferring. In the DIR 5, a power supply terminal VCC is connected to an output terminal VOUT of the power supply for the DIR 6. In the DIR 5, the SPDIF signal is input to an input terminal INPUT. In the DIR 5, a reset terminal RESET is connected to the detection circuit 4 and the microcomputer 2. In the DIR 5, an output terminal I2SDATA is connected to the detection circuit 7 and the DAC 8. The DIR 5 has multiple input terminals. In the first embodiment, the SPDIF signal is input to a route (the input terminal INPUT) that becomes valid at first in the DIR 5 after releasing reset of the DIR 5.

In the power supply for the DIR 6, the output terminal VOUT is connected to the power supply terminal VCC of the DIR 5. The power supply for the DIR 6 supplies power supply voltage to the DIR 5 when the detection signal is supplied to an enable terminal EN. In the DIR 5, the detection signal is supplied to the reset terminal RESET. Therefore, in the DIR 5, reset is released, power supply voltage is supplied from the power supply for the DIR 6, and the DIR 5 converts the SPDIF signal into the I2S signal when the detection circuit 4 supplies the detection signal.

The detection circuit 7 (second detection circuit) detects that the I2S signal into which the DIR 5 converts is an audio signal indicating sound and supplies a detection signal (second detection signal). FIG. 3 (b) is a diagram illustrating circuit configuration of the detection circuit 7. As illustrated in FIG. 3 (b), the detection circuit 7 has a bipolar transistor Q1. The bipolar transistor Q1 (first bipolar transistor) is an npn type, that is to say, a bipolar transistor that becomes ON state when base voltage is high level potential against emitter voltage. The I2S signal is input to a base of the bipolar transistor Q1. A collector of the bipolar transistor Q1 is connected to the power supply VCC via a resistor R1. An emitter of the bipolar transistor Q1 is connected to ground potential. In the detection circuit 7, output is between the resistor R1 and the collector of the bipolar transistor Q1. In the bipolar transistor Q1, a resistor R6 is connected between the base and the emitter. A resistor R7 is connected to the base of the bipolar transistor Q1.

In the I2S signal, an audio signal indicating silence is low level, and an audio signal indicating sound includes a high level signal. The high level signal is input to the base of the bipolar transistor Q1, the bipolar transistor Q1 becomes ON state, and the detection circuit 7 supplies the low level signal from the output as the detection signal. The microcomputer 2 activates the AV receiver 1 when the detection circuit 7 supplies the detection signal. The DAC 8 D/A-converts the I2S signal (digital audio signal) that the DIR 5 outputs into an analog audio signal.

Figure 4:
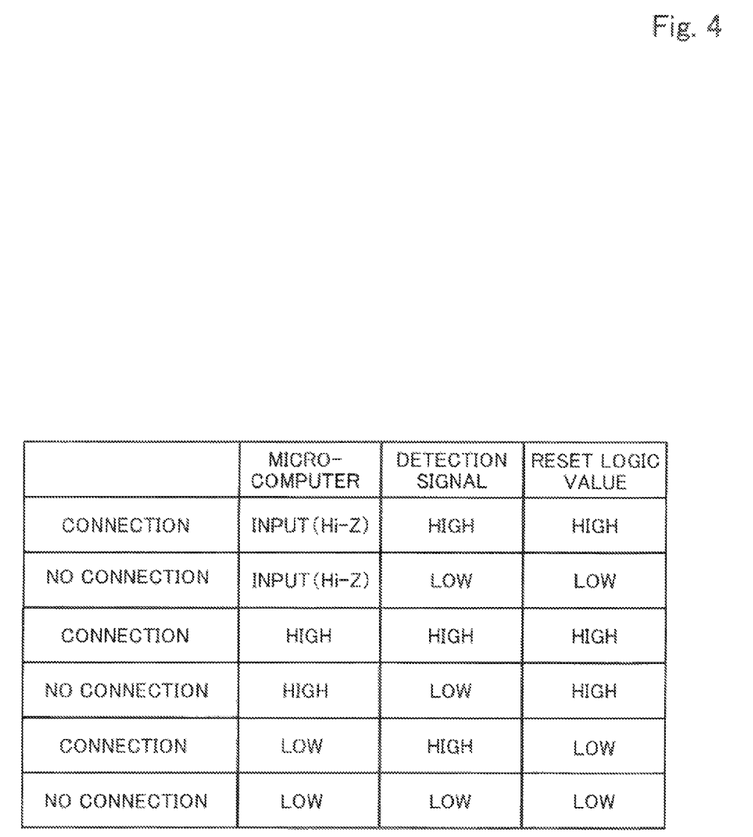
FIG. 4 is a diagram illustrating a logic value of a reset terminal of a DIR.

FIG. 4 is a diagram illustrating a logic value of the reset terminal RESET of the DIR 5. As illustrated in FIG. 4, a high level signal or a low level signal is supplied to the reset terminal RESET based on a detection signal from the microcomputer 2 and the detection circuit 4.

Figure 5:
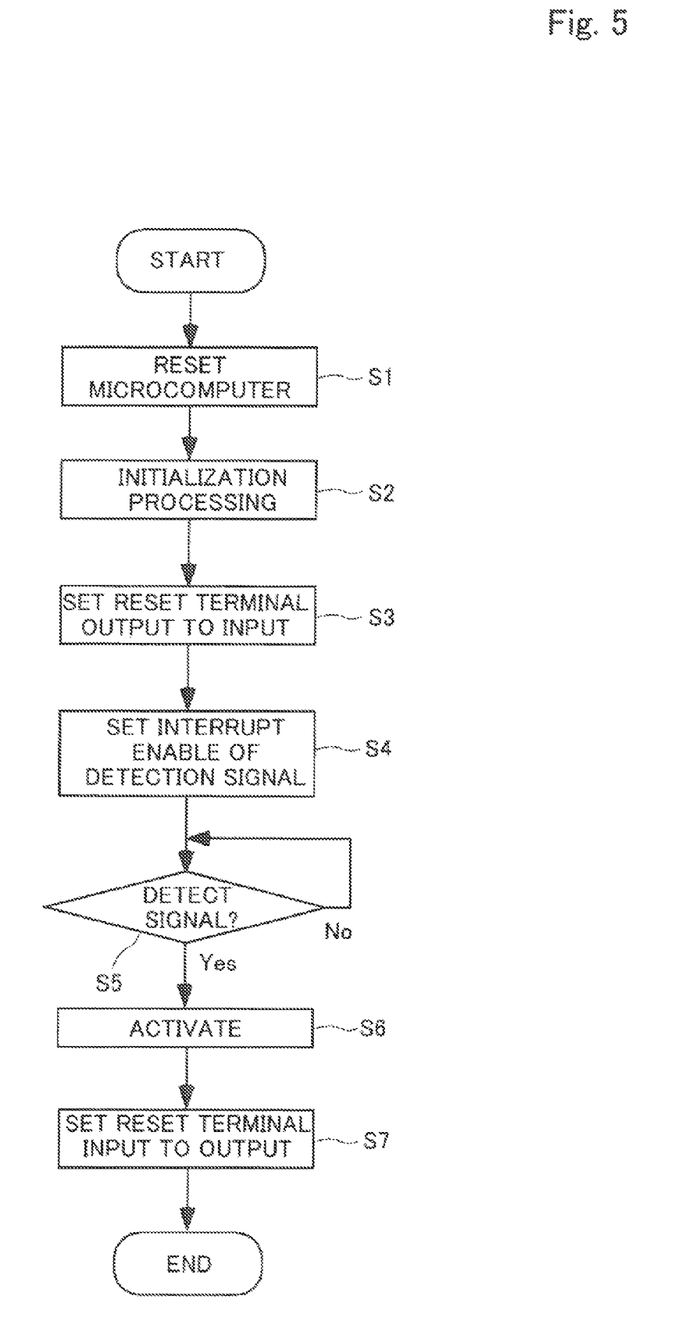
FIG. 5 is a flowchart illustrating processing operation in the case where a microcomputer activates the AV receiver.

Processing operation in case where the microcomputer 2 activates the AV receiver 1 will be described with reference to a flow chart illustrated in FIG. 5 below. First, the microcomputer 2 performs reset (S1). Next, the microcomputer 2 performs initialization processing (S2). Next, the microcomputer 2 sets the reset terminal RESET of the DIR 5 from output to input (S3). Next, the microcomputer 2 sets interrupt enable of the detection signal by the detection circuit 7 (S4). Next, the microcomputer 2 judges whether the detection circuit 7 supplies the detection signal or not (S5). While the microcomputer 2 judges that the detection circuit 7 does not supply the detection signal (S5: No), it performs processing of S5 repeatedly. When the microcomputer 2 judges that the detection circuit 7 supplies the detection signal (S5: Yes), it activates the AV receiver 1 (S6: No). Next, the microcomputer 2 sets the reset terminal RESET of the DIR 5 from output to input (S7).

As described in the above, it cannot be judged whether the SPDIF signal is an audio signal indicating sound or not because the SPDIF signal is a bi-phase signal. In the present embodiment, the DIR 5 converts the SPDIF signal into the I2S signal. In the I2S signal, an audio signal indicating silence is low level. For this reason, the detection circuit 7 can detect that the I2S signal is an audio signal indicating sound by detecting a signal including high level and supply the detection signal. And, when the detection circuit 7 supplies the detection signal, the microcomputer 2 activates the AV receiver 1.

Thus, according to the present embodiment, when the SPDIF signal is an audio signal indicating sound, the AV receiver 1 can be activated.

Further, in the present embodiment, the power supply for the DIR 6 is connected to the power supply terminal VCC of the DIR 5. When the detection signal is supplied to the enable terminal EN of the power supply for the DIR 6 from the detection circuit 4, the power supply for the DIR 6 supplies the power supply voltage to the DIR 5. Therefore, when the digital audio signal terminal is connected, the power supply voltage can be supplied to the DIR 5.

Further, in the present embodiment, the detection signal from the detection circuit 4 is supplied to the reset terminal RESET of the DIR 5. Therefore, for example, in the DIR 5, reset is released because a high level signal as the detection signal is supplied to the reset terminal RESET of the DIR 5.

Further, in the present embodiment, the I2S signal is input to the base of the npn type bipolar transistor Q1 composing the detection circuit 7. The collector of the bipolar transistor Q1 is connected to the power supply VCC via the resistor R1. Further, the emitter of the bipolar transistor Q1 is connected to ground potential. Further, the output of the detection circuit 7 is between the resistor R1 and the collector of the bipolar transistor Q1.

Herein, in the I2S signal, an audio signal indicating silence is low level and an audio signal indicating sound includes a high level signal. The bipolar transistor Q1 becomes ON state because the high level signal is input to the base of the bipolar transistor Q1. The detection circuit 7 supplies a low level signal from the output as the detection signal. Thus, according to the present embodiment, an audio signal indicating sound can be detected by the detection circuit 7 of simple configuration using the bipolar transistor.

Further, in the present embodiment, the SPDIF signal is input to the base of the npn type bipolar transistor Q2 composing the detection circuit 4. Further, the emitter of the bipolar transistor Q2 is connected to ground potential. Further, the collector of the bipolar transistor Q2 is connected to the base of the bipolar transistor Q3. Further, the base of the pnp type bipolar transistor Q3 composing the detection circuit 4 is connected to the collector of the bipolar transistor Q2. Further, the collector of the bipolar transistor Q3 is the output of the detection circuit 4. Further, the emitter of the bipolar transistor Q3 is connected to the power supply VCC.

Therefore, when the digital audio signal terminal is connected and the SPDIF signal is input, the base voltage of the bipolar transistor Q2 is high level potential against the emitter voltage of the bipolar transistor Q2 and the bipolar transistor Q2 becomes ON state. Due to this, the base voltage of the bipolar transistor Q3 is low level potential against the emitter voltage of the bipolar transistor Q3 and the bipolar transistor Q3 becomes ON state. For this reason, the detection circuit 4 supplies a high level signal from the output as the detection signal. Thus, according to the present embodiment, the detection circuit 4 of simple configuration using the bipolar transistor can detect that the digital signal terminal is connected.

Figure 6:
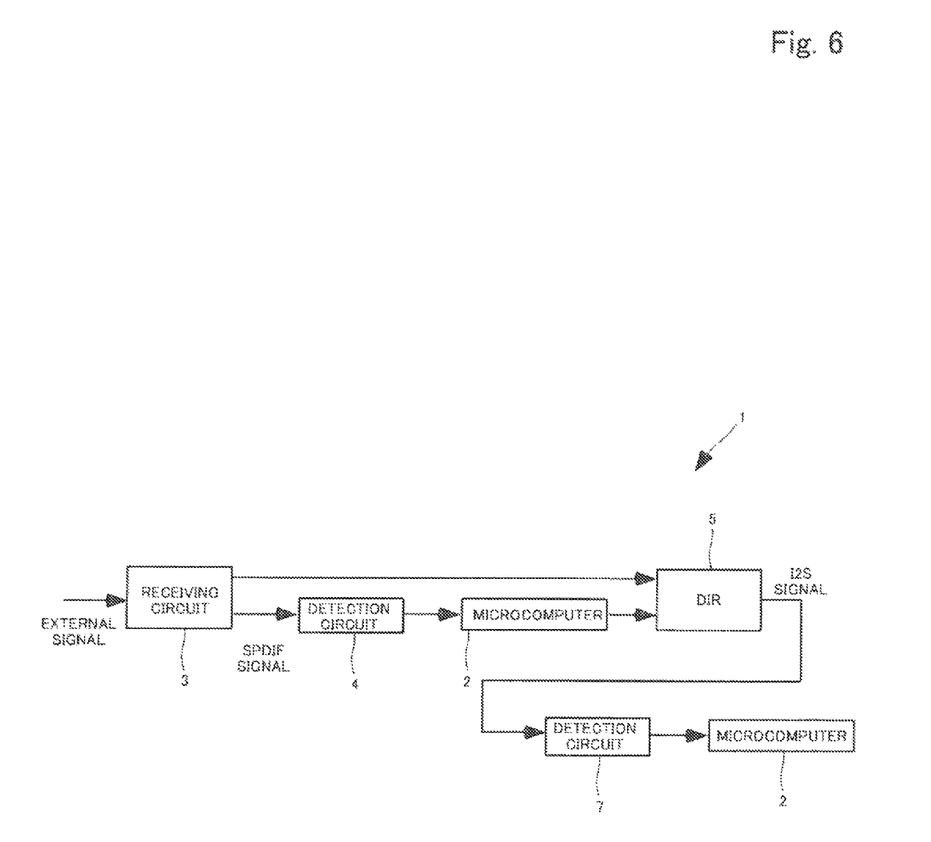
FIG. 6 is a block diagram illustrating configuration of an AV receiver according to a second embodiment of the present invention.
Figure 7:
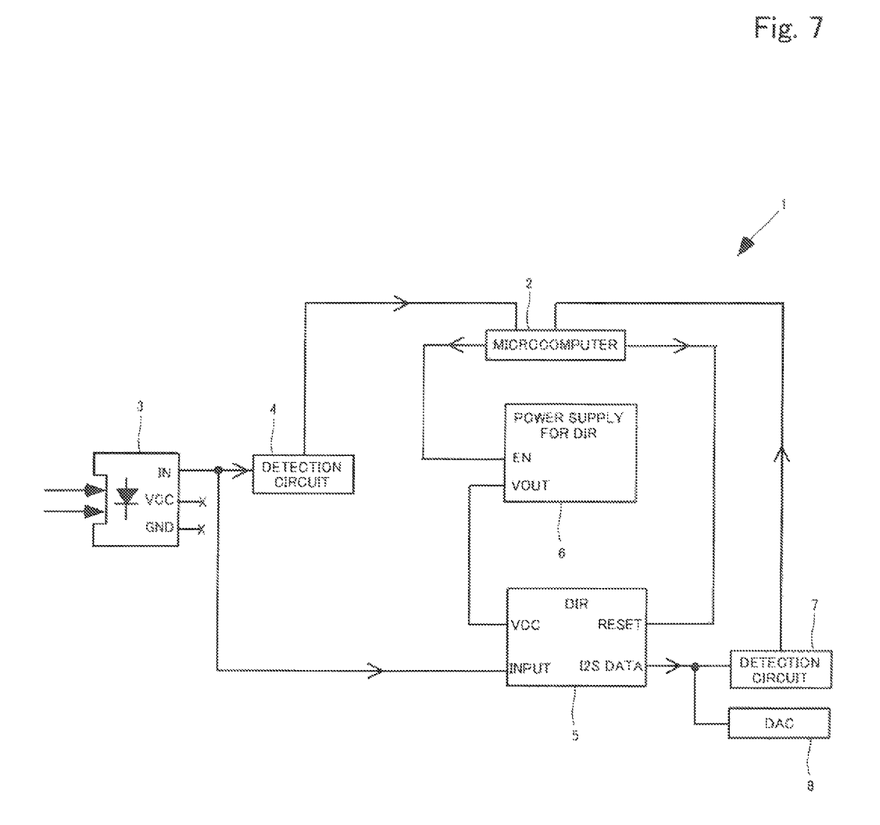
FIG. 7 is a block diagram illustrating configuration of the AV receiver according to the second embodiment of the present invention.

FIG. 6 and FIG. 7 are respectively a block diagram illustrating configuration of an AV receiver according to a second embodiment of the present invention. Configuration overlapping the first embodiment will be omitted below. An AV receiver 1 includes a microcomputer 2, a receiving circuit 3, a detection circuit 4, a DIR 5, a power supply for the DIR 6, a detection circuit 7, and a DAC 8.

When the detection circuit 4 supplies a detection signal, the microcomputer 2 activates the DIR 5. Further, the microcomputer 2 is connected to an enable terminal EN of the power supply for the DIR 6. When the detection circuit 4 supplies the detection signal, the microcomputer 2 supplies an enable signal to the enable terminal EN. Further, the microcomputer 2 is connected to a reset terminal RESET of the DIR 5. When the detection circuit 4 supplies the detection signal, the microcomputer 2 supplies the reset signal to the reset terminal RESET. In the second embodiment, the DIR 5 has multiple input terminals. An SPDIF signal is input to a route (input terminal INPUT) that becomes valid at first in the DIR 5 after releasing reset of the DIR 5.

The power supply for the DIR 6 is connected to the power supply terminal VCC of the DIR 5. When the enable signal is supplied to the enable terminal EN of the power supply for the DIR 6, the power supply for the DIR 6 supplies the power supply voltage to the DIR 5.

Figure 8:
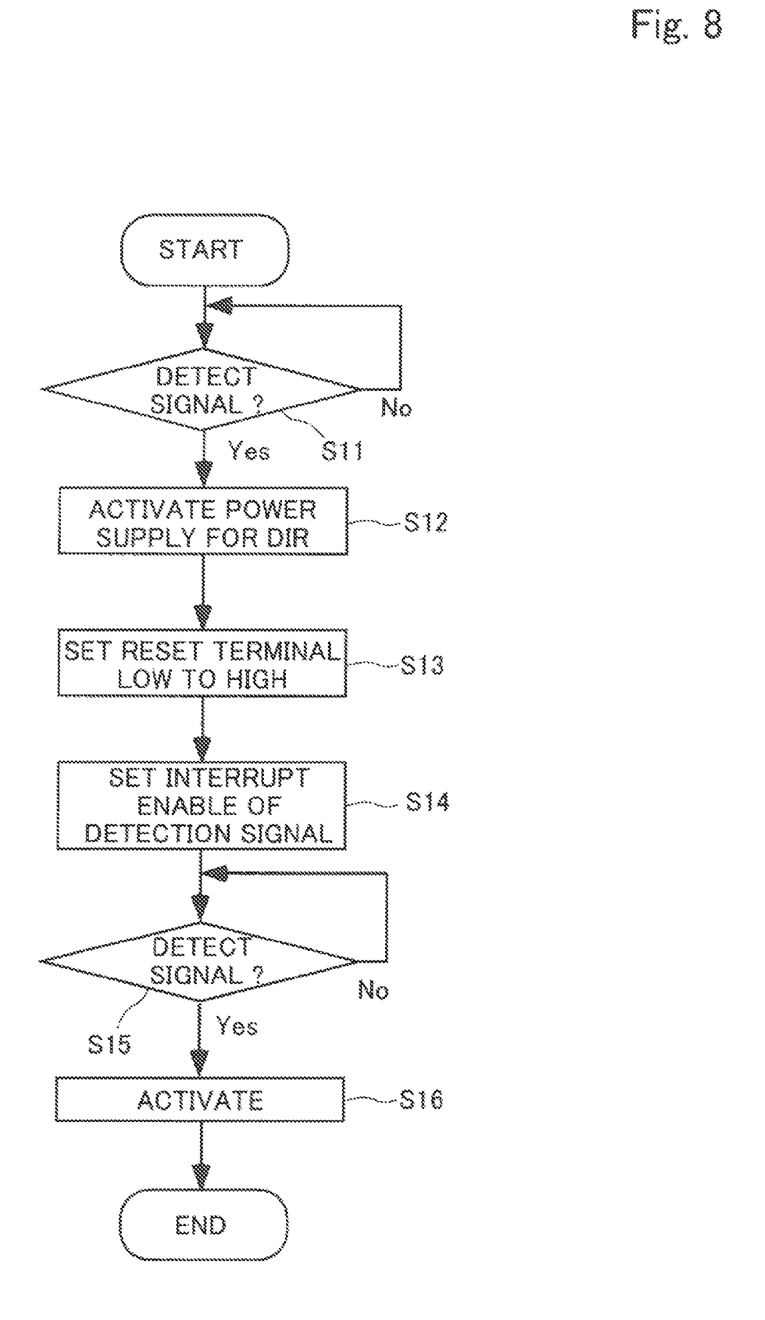
FIG. 8 is a flowchart illustrating processing operation in the case where a microcomputer activates the AV receiver.

Processing operation in case where the microcomputer 2 activates the AV receiver 1 will be described with reference to a flow chart illustrated in FIG. 8 below. First, the microcomputer 2 judges whether the detection circuit 4 detects that a digital audio signal terminal is connected and supplies the detection signal or not (S11). While the microcomputer 2 judges that the detection circuit 4 does not supply the detection signal (S11: No), it performs processing of S11 repeatedly.

When the microcomputer 2 judges that the detection circuit 4 supplies the detection signal (S11: Yes), it supplies the enable signal to the enable terminal EN of the power supply for the DIR 6 so as to activate the power supply for the DIR 6 (S12). Next, the microcomputer 2 supplies the reset signal to the reset terminal RESET of the DIR 5 (S13). Namely, the microcomputer 2 sets the reset terminal RESET of the DIR 5 from low to high. Next, the microcomputer 2 sets interrupt enable of the detection signal by the detection circuit 7 (S14). Next, the microcomputer 2 judges whether the detection circuit 7 supplies the detection signal or not (S15).

While the microcomputer 2 judges that the detection circuit 7 does not supply the detection signal (S15: No), it performs processing of S15 repeatedly. When the microcomputer 2 judges that the detection circuit 7 supplies the detection signal (S15: Yes), it activates the AV receiver 1 (S16).

As described in the above, in the present embodiment, the power supply for the DIR 6 is connected to the power supply terminal VCC of the DIR 5. When the enable signal is supplied to the enable terminal EN of the power supply for the DIR 6, the power supply for the DIR 6 supplies the power supply voltage to the DIR 5. Therefore, when the digital audio signal terminal is connected, the power supply voltage can be supplied to the DIR 5.

Further, in the present embodiment, the microcomputer 2 is connected to the reset terminal RESET of the DIR 5. When the detection circuit 4 supplies the detection signal, the microcomputer 2 supplies the reset signal to the reset terminal RESET of the DIR 5. Therefore, for example, in the DIR 5, reset is released because a high level signal as a reset signal is supplied to the reset terminal RESET.

Third Embodiment

Figure 9:
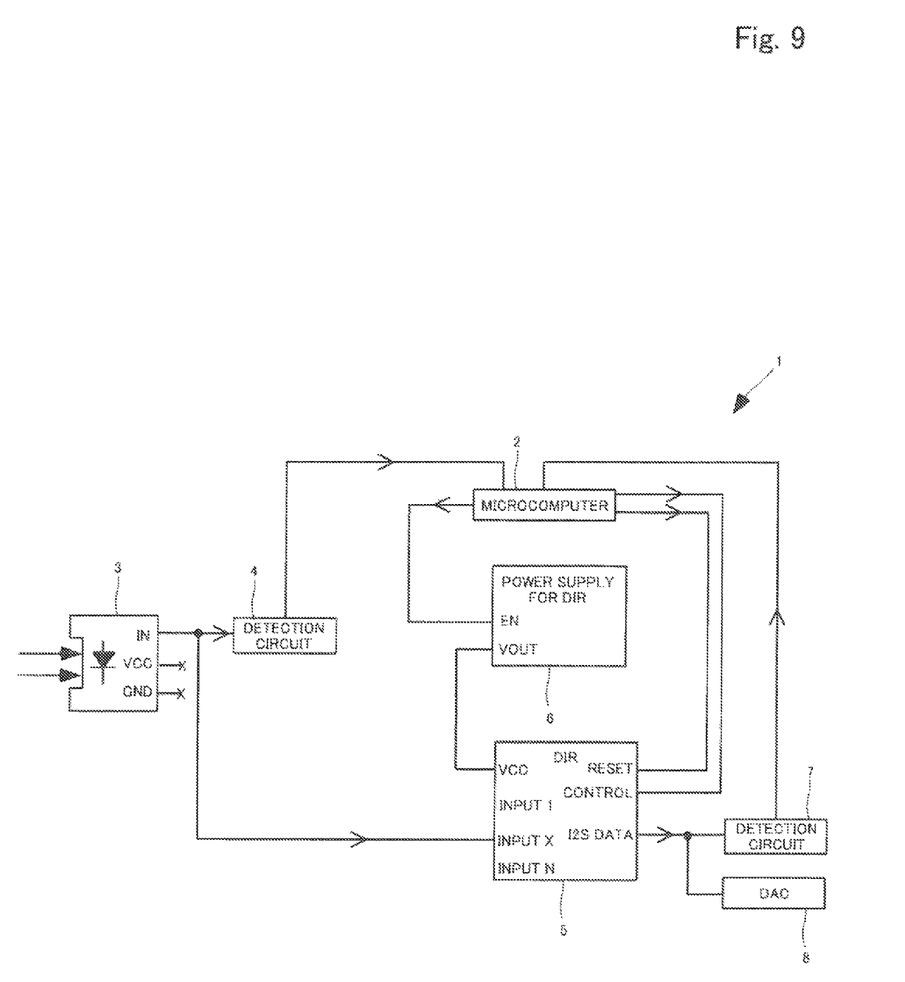
FIG. 9 is a block diagram illustrating configuration of an AV receiver according to a third embodiment of the present invention.

FIG. 9 is a block diagram illustrating configuration of an AV receiver according to a third embodiment of the present invention. In the third embodiment, configuration that the microcomputer 2 is connected to a control terminal CONTROL of the DIR 5 is mainly different compared with the AV receiver 1 according to the second embodiment.

The DIR 5 has multiple input terminals INPUT 1 to N to which an SPDIF signal is input. The SPDIF signal is input to one input terminal INPUT X of the multiple input terminals INPUT 1 to N. The microcomputer 2 sets input of the DIR 5 to optional input terminal X by supplying a control signal to the control terminal CONTROL after releasing reset of the DIR 5.

Figure 10:
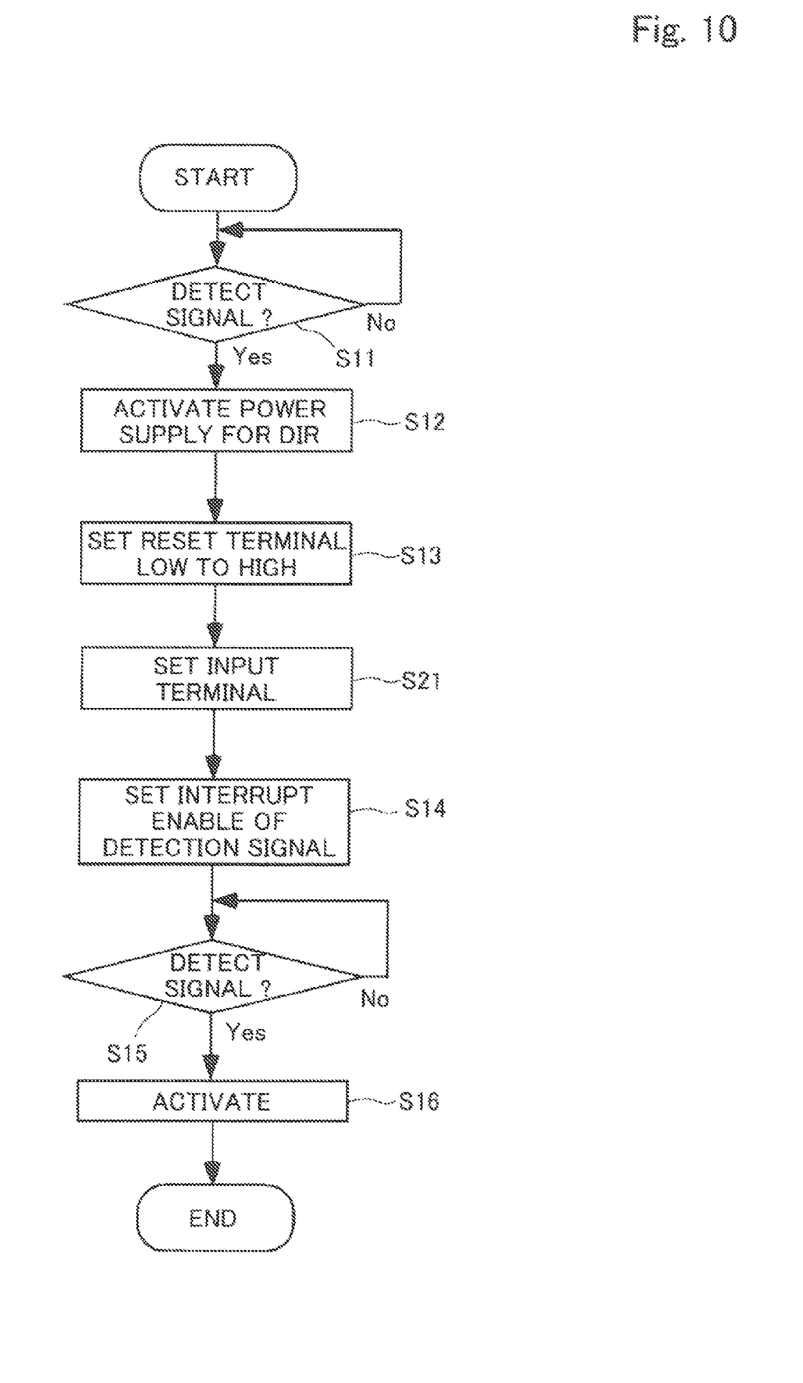
FIG. 10 is a flowchart illustrating processing operation in the case where a microcomputer activates the AV receiver.

FIG. 10 is a flow chart illustrating processing operation in case where the microcomputer 2 activates the AV receiver 1. Point to which processing of S21 is added is different compared with the flow chart illustrated in FIG. 8 (the second embodiment). After processing of S11 to S13, the microcomputer 2 sets the input of DIR 5 to an optional input terminal INPUT X by supplying the control signal to the control terminal CONTROL (S21). After processing of S21, the microcomputer 2 performs processing of S14 to S16.

As described in the above, in the present embodiment, the microcomputer 2 sets the input of the DIR 5 to the optional input terminal INPUT X by supplying the control signal to the control terminal CONTROL after releasing reset of the DIR 5. Therefore, the SPDIF signal can be input to the optional input terminal. In the present embodiment, the SPDIF signal is input to the input terminal INPUT X, but the SPDIF signal can be input to the other input terminal.

The embodiment of the present invention is described above, but the mode to which the present invention is applicable is not limited to the above embodiment and can be suitably varied without departing from the scope of the present invention.

In the above mentioned embodiment, the AV receiver is illustrated as an audio processing device. Not limited to this, it may be the other audio processing device.

The present invention can be suitably employed in the audio processing device that performs audio signal processing to the digital audio signal.

What is claimed is:

1. An audio processing device comprising:
  a first detection circuit that detects that a digital audio signal terminal is connected and supplies a first detection signal;
  a conversion circuit that converts a first digital audio signal that complies with a first standard for transferring between two pieces of equipment into a second digital audio signal that complies with a second standard for serially transferring when the first detection circuit supplies the first detection signal;
  a second detection circuit that detects, as a result of the second digital audio signal's compliance with the second standard, that the second digital audio signal into which the conversion circuit converts is an audio signal indicating sound and supplies a second detection signal; and
  a microcomputer that activates a self-device when the second detection circuit supplies the second detection signal.

2. The audio processing device according to claim 1, further comprising: a power supply for the conversion circuit;
  wherein the first detection signal is supplied to an enable terminal of the power supply for the conversion circuit, and
  the power supply for the conversion circuit is connected to a power supply terminal of the conversion circuit and supplies power supply voltage to the conversion circuit when the first detection signal is supplied to the enable terminal.

3. The audio processing device according to claim 1, wherein the first detection signal is supplied to a reset terminal of the conversion circuit.

4. The audio processing device according to claim 1, wherein the second detection circuit has an npn type first bipolar transistor in which a collector is connected to a power supply via a resistor, and in which an emitter is connected to ground potential,
  the second digital audio signal is input to a base of the first transistor, and
  an output of the second detection circuit is between the resistor and the collector of the first bipolar transistor.

5. The audio processing device according to claim 1, wherein the first detection circuit has an npn type second bipolar transistor in which an emitter is connected to ground potential and in which a collector is connected to a base of a third bipolar transistor and a pnp type third transistor in which a base is connected to the collector of the second bipolar transistor, in which a collector is an output of the first detection circuit, and in which an emitter is connected to a power supply, and
  the first digital audio signal is input to a base of the second bipolar transistor.

6. The audio processing device according to claim 1, wherein the conversion circuit is a digital interface receiver.

7. The audio processing device according to claim 1, wherein the first digital audio signal is a Sony/Philips Digital Interconnect Format (SPDIF) signal.

8. The audio processing device according to claim 1, wherein the second digital audio signal is an Inter-IC Sound (I2S) signal.

9. An audio processing device comprising: a first detection circuit that detects that a digital audio signal terminal is connected and supplies a first detection signal;
  a microcomputer that activates a conversion circuit when the first detection circuit supplies the first detection signal;
  the conversion circuit that converts a first digital audio signal that complies with a first standard for transferring between two pieces of equipment into a second digital audio signal that complies with a second standard for serially transferring; and
  a second detection circuit that detects, as a result of the second digital audio signal's compliance with the second standard, that the second digital audio signal into which the conversion circuit converts is an audio signal indicating sound and supplies a second detection signal; wherein
  the microcomputer activates a self-device when the second detection circuit supplies the second detection signal.

10. The audio processing device according to claim 9, wherein the conversion circuit has multiple input terminals to which the first digital audio signal is input,
  the first digital audio signal is input to one of the multiple input terminals, and
  the microcomputer is connected to a control terminal of the conversion circuit.

11. The audio processing device according to claim 9, further comprising: a power supply for the conversion circuit;
  wherein the microcomputer is connected to an enable terminal of the power supply for the conversion circuit and supplies an enable signal to the enable terminal when the first detection circuit supplies the first detection signal, and the power supply for the conversion circuit is connected to a power supply terminal of the conversion circuit and supplies power supply voltage to the conversion circuit when the enable signal is supplied to the enable terminal.

12. The audio processing device according to claim 9, wherein the microcomputer is connected to a reset terminal of the conversion circuit and supplies a reset signal to the reset terminal when the first detection circuit supplies the first detection signal.

\* \* \* \* \*